United States Patent
Yang et al.

(10) Patent No.: US 10,276,652 B1
(45) Date of Patent: Apr. 30, 2019

(54) SCHOTTKY DIODE

(71) Applicant: UNITED MICROELECTRONICS CORP., Hsin-Chu (TW)

(72) Inventors: Cheng-Hua Yang, Hsinchu (TW);
Ke-Feng Lin, Taipei (TW);
Ming-Tsung Lee, Yilan County (TW);
Shih-Teng Huang, Taichung (TW);
Chih-Chung Wang, Hsinchu (TW);
Chiu-Te Lee, Hsinchu County (TW);
Shu-Wen Lin, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/005,652

(22) Filed: Jun. 11, 2018

(30) Foreign Application Priority Data

May 17, 2018 (CN) .......................... 2018 1 0473287

(51) Int. Cl.
*H01L 29/06* (2006.01)
*H01L 29/872* (2006.01)

(52) U.S. Cl.
CPC ...... *H01L 29/0623* (2013.01); *H01L 29/0649* (2013.01); *H01L 29/872* (2013.01)

(58) Field of Classification Search
CPC .......................... H01L 29/0623; H01L 29/872; H01L 29/0649
See application file for complete search history.

(56) References Cited

U.S. PATENT DOCUMENTS

| 7,709,908 | B2 * | 5/2010 | Su | H01L 29/7835 257/409 |
| 7,863,682 | B2 * | 1/2011 | Okuno | H01L 29/0692 257/339 |
| 8,587,058 | B2 | 11/2013 | Lin | |
| 8,604,582 | B2 * | 12/2013 | Lee | H01L 29/66143 257/471 |
| 8,786,362 | B1 | 7/2014 | Lin | |
| 8,878,329 | B2 | 11/2014 | Tsai | |
| 9,202,939 | B2 | 12/2015 | Liao | |
| 9,607,944 | B1 * | 3/2017 | Hung | H01L 29/0692 |
| 9,691,911 | B1 | 6/2017 | Hsiao | |
| 9,825,123 | B2 | 11/2017 | Nagaoka | |
| 2002/0125482 | A1 | 9/2002 | Friedrichs | |
| 2008/0001159 | A1 * | 1/2008 | Ota | H01L 29/0623 257/77 |
| 2008/0006899 | A1 | 1/2008 | Kim | |
| 2009/0090920 | A1 * | 4/2009 | Endo | H01L 29/872 257/77 |
| 2010/0200941 | A1 * | 8/2010 | Fujikata | B82Y 20/00 257/432 |

(Continued)

*Primary Examiner* — Victor A Mandala
(74) *Attorney, Agent, or Firm* — Winston Hsu

(57) ABSTRACT

A schottky diode includes a schottky junction, an ohmic junction, a first isolation structure and a plurality of doped regions. The schottky junction includes a first well in a substrate and a first electrode contacting the first well. The ohmic junction includes a junction region in the first well and a second electrode contacting the junction region. The first isolation structure is disposed in the substrate and separates the schottky junction from the ohmic junction. The doped regions are located in the first well and under the schottky junction, wherein the doped regions separating from each other constitute a top-view profile of concentric circles.

20 Claims, 4 Drawing Sheets

(56) References Cited

U.S. PATENT DOCUMENTS

| | | | |
|---|---|---|---|
| 2010/0224953 A1 | 9/2010 | Sheen | |
| 2010/0244049 A1* | 9/2010 | Yamamoto | H01L 21/0465 257/77 |
| 2011/0163409 A1* | 7/2011 | Mizushima | H01L 29/0661 257/484 |
| 2011/0175106 A1* | 7/2011 | Mizukami | H01L 29/0692 257/77 |
| 2012/0223337 A1* | 9/2012 | Terano | H01L 29/87 257/77 |
| 2013/0001734 A1 | 1/2013 | Yang | |
| 2015/0340443 A1* | 11/2015 | Wada | H01L 29/0623 257/77 |

* cited by examiner

SCHOTTKY DIODE

BACKGROUND OF THE INVENTION

1. Field of the Invention

The present invention relates generally to a schottky diode, and more specifically to a schottky diode including doped regions with same spacings.

2. Description of the Prior Art

A schottky diode may include a schottky contact constituted by a metal contacting a semiconductor substrate. Since there is no minority carrier in the metal, currents in the schottky diode only generate by the moving of majority carriers. The majority carriers are injected into the conduction band of the metal through the junction of the semiconductor substrate and the metal. Since this process does not involve the combination of majority carriers and minority carriers, the turn-off time of the schottky diode can be less than the turn-off time of a P-N junction diode. Due to the less turn-off time and the lower turn-on voltage drop of the Schottky diode, the schottky diode can switch quickly without excessive time delay. Thereby, Schottky diode is widely used in electronic devices.

SUMMARY OF THE INVENTION

The present invention provides a schottky diode, which includes doped regions with same spacings, thereby the electrical performance of the schottky diode in every part of a wafer can being uniform.

The present invention provides a schottky diode including a schottky junction, an ohmic junction, a first isolation structure and a plurality of doped regions. The schottky junction includes a first well in a substrate and a first electrode contacting the first well. The ohmic junction includes a junction region in the first well and a second electrode contacting the junction region. The first isolation structure is disposed in the substrate and separates the schottky junction from the ohmic junction. The doped regions are located in the first well and under the schottky junction, wherein the doped regions separating from each other constitute a top-view profile of concentric circles.

According to the above, the present invention provides a schottky diode, which includes a schottky junction, an ohmic junction, a first isolation structure and a plurality of doped regions. The schottky junction includes a first well in a substrate and a first electrode contacting the first well. The ohmic junction includes a junction region in the first well and a second electrode contacting the junction region. The first isolation structure is disposed in the substrate and separates the schottky junction from the ohmic junction. The doped regions are located under the schottky junction, wherein the doped regions separating from each other constitute a top-view profile of concentric circles. The doped regions have same spacings, hence the electrical performance of the schottky diode such as circuit leakage and breakdown voltage in every part of a wafer can be uniform.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
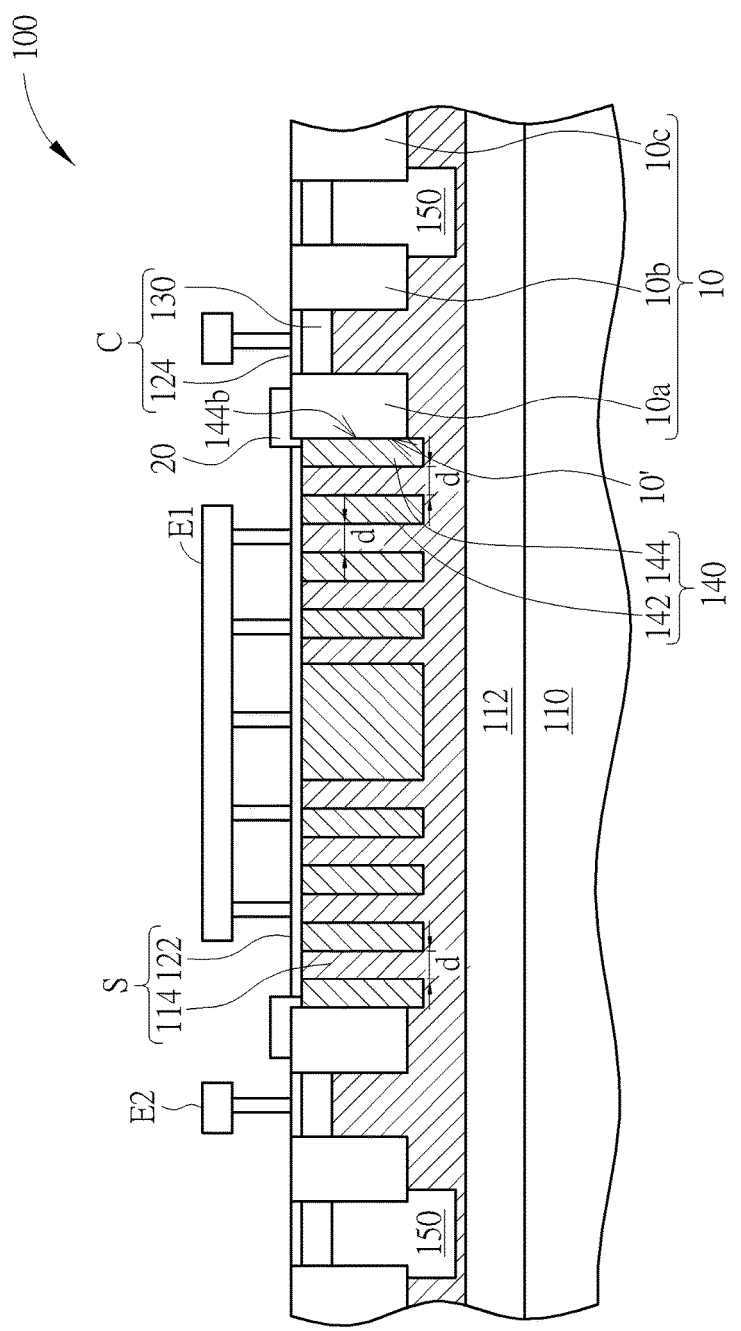
FIG. 1 schematically depicts a cross-sectional view of a schottky diode according to an embodiment of the present invention.

FIG. 1 schematically depicts a cross-sectional view of a schottky diode according to an embodiment of the present invention. As shown in FIG. 1, the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An embedded well 112 may be selectively formed in the substrate 110 to prevent circuit leakage from flowing downward. A first well 114 is formed in the substrate 110 and on the embedded well 112. The first well 114 has a first conductive type while the embedded well 112 has a second conductive type. The second conductive type is opposite to the first conductive type. For example, the first conductive type is N-type while the second conductive type is P-type, but it is not limited thereto. A first electrode 122 is located on the substrate 110 and directly contacts the first well 114. Therefore, a schottky junction is constituted by the first well 114 located in the substrate 110 and the first electrode 122 contacting the first well 114. Moreover, the junction region 130 is formed in the first well 114, and a second electrode 124 is located on the substrate 110 and directly contacts the junction region 130, and thus constitute an ohmic junction. The junction region 130 may have the first conductive type, and may have a higher doping concentration than the concentration of the first well 114, but it is not limited thereto. In this embodiment, the first electrode 122 and the second electrode 124 are metal silicides, and the first electrode 122 and the second electrode 124 may be formed by one same process, but it is not limited thereto. In one case, the first electrode 122 is contacted to an anode E1 while the second electrode 124 is contacted to a cathode E2.

First isolation structures 10 are formed in the substrate 110 to separate the schottky junction S from the ohmic junction C. The first isolation structures 10 may be shallow trench isolation (STI) structures, which may be formed by a shallow trench isolation (STI) process, but it is not limited thereto. The first isolation structures 10 are spaced apart from the first electrode 122. In this embodiment, the salicide block 20 are disposed on the substrate 110 and between the first electrode 122 and the first isolation structures 10 to ensure the first electrode 122 being prevented from the first isolation structures 10.

A plurality of doped regions 140 are formed in the first well 114 and under the schottky junction S. The doped regions 140 have the second conductive type while the first well 114 has the first conductive type. The doped regions 140 may include a plurality of inner doped regions 142 and a peripheral doped region 144 surrounding the inner doped regions 142, wherein the inner doped regions 142 are separated from each other, and the peripheral doped region 144 directly contacts the first isolation structures 10. Preferably, the salicide blocks 20 only overlap a part of the peripheral doped region 144 while the other part of the peripheral doped region 144 protrudes from the salicide blocks 20. Other doped regions 150 may be formed between the first isolation structures 10.

The doped regions 140 of the present invention must have common spacings d, thereby the electrical performance of the schottky diode 100 in every part of a wafer such as circuit leakage and breakdown voltage of the schottky diode 100 in every part of the wafer including at the center of the wafer and at the edge of the wafer can being uniform. One embodiment of a layout of the doped regions 140 having same spacings d is presented as follows, but it is not restricted thereto.

Figure 2:
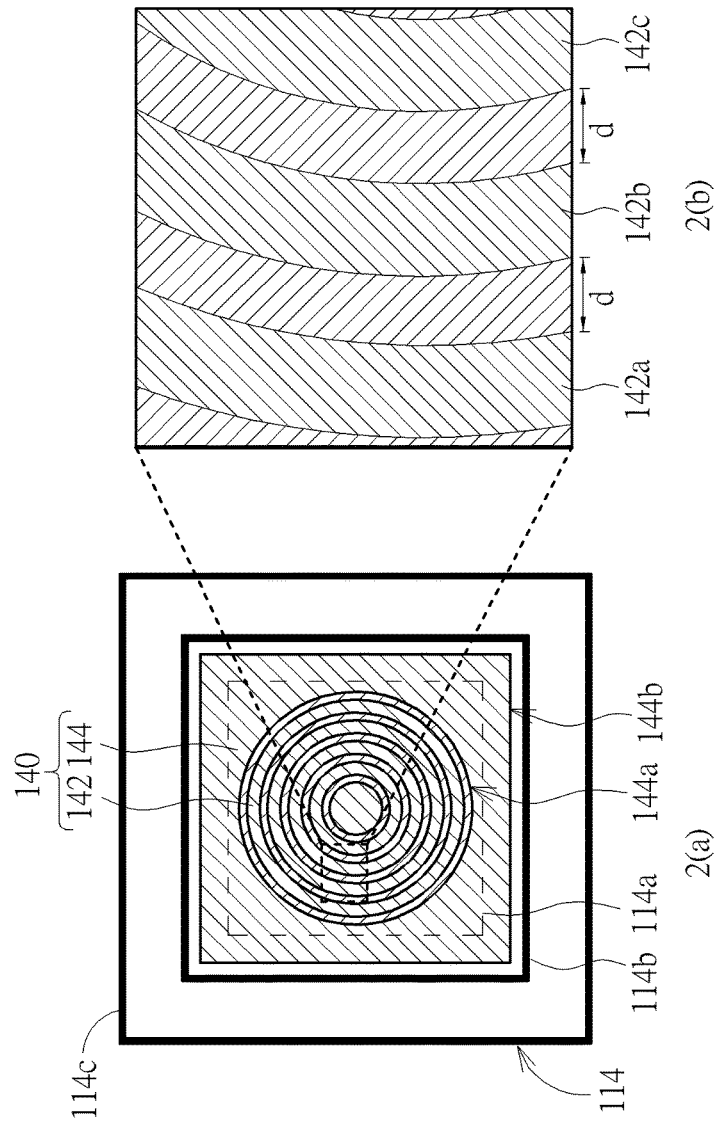
FIG. 2 schematically depicts a top view of doped regions and a first well of a schottky diode according to an embodiment of the present invention.
Figure 3:
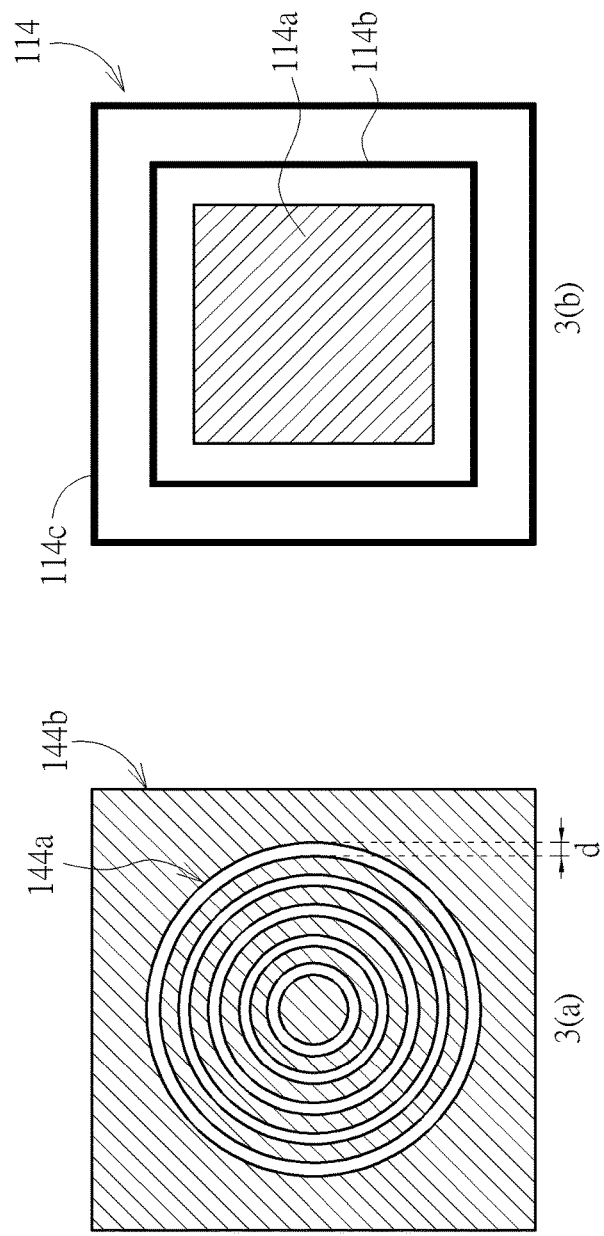
FIG. 3 schematically depicts a top view of doped regions and a first well of a schottky diode according to an embodiment of the present invention.

FIG. 2 schematically depicts a top view of doped regions and a first well of a schottky diode according to an embodiment of the present invention, wherein FIG. 2(a) depicts a top view of doped regions and a first well of a schottky diode, and FIG. 2(b) depicts the partial enlargement of FIG. 2(a). FIG. 3 schematically depicts a top view of doped regions and a first well of a schottky diode according to an embodiment of the present invention, wherein FIG. 3(a) depicts a top view of doped regions of a schottky diode, and FIG. 3 (b) depicts a top view of a first well of a schottky diode. Please refer to FIGS. 2-3. The doped regions 140 of the present invention are separated from each other and constitute a top-view profile of concentric circles. In other words, the doped regions 140 of the present invention have common spacings d. More precisely, the doped regions 140 have a plurality of inner doped regions 142 and a peripheral doped region 144 surrounding the inner doped regions 142. Each of the inner doped regions 142 (including the inner doped regions 142a/142b/142c) are separated from each other and have common spacings d. In a preferred embodiment, each of the inner doped regions 142 has a top-view profile of a circular ring. The peripheral doped region 144 has an inner side 144a and an outer side 144b. Preferably, the inner side 144a has a circular shape top-view profile while the outer side 144b has a rectangular shape top-view profile. Therefore, the same spacing d is between the inner side 144a of the peripheral doped region 144 and the nearest inner doped region 142. The outer side 144b of the peripheral doped region 144 preferably has a rectangular shape top-view profile, to integrate with other adjacent semiconductor components with a minimum area layout, and thus improve the integration of integrated circuit in a wafer. As the outer side 144b of the peripheral doped region 144 has a rectangular shape top-view profile, inner sides 10' of the first isolation structures 10 directly contacting the outer side 144b of the peripheral doped region 144 preferably have rectangular shape top-view profiles. In another embodiment, the inner sides 10' of the first isolation structures 10 may have circular shape top-view profiles, to partially contact the outer side 144b of the peripheral doped region 144. As shown in FIG. 3 (b), the first well 114 has a rectangular shape top-view profile or a top-view profile of concentric rectangles. The first well 114, being seen in the top-view, may include a first part 114a, a second part 114b and a third part 114c. The doped regions 140 overlap the first part 114a. The second part 114b is located between the first isolation structures 10a and the first isolation structures 10b, and the doped regions 150 are located in the third part 114c, but it is not limited thereto.

Figure 4:
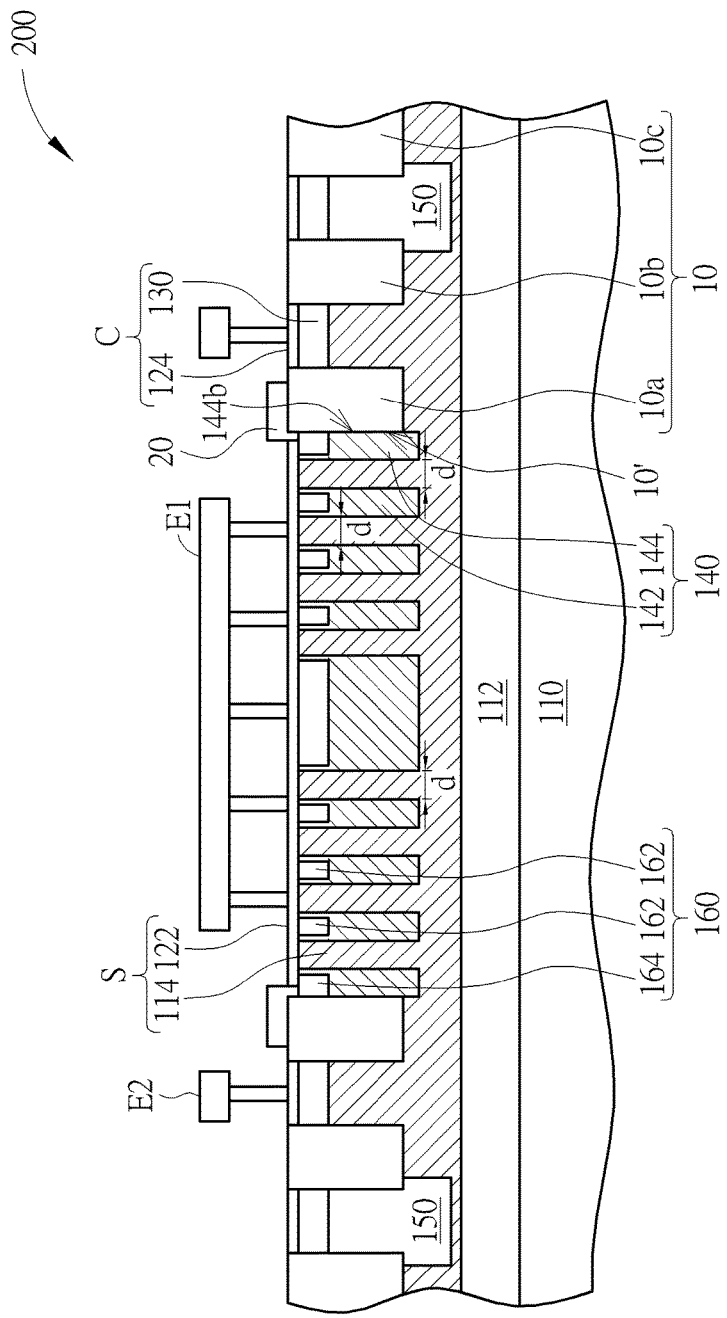
FIG. 4 schematically depicts a cross-sectional view of a schottky diode according to an embodiment of the present invention.

A preferred embodiment is presented as follows, to reduce circuit leakage of the schottky diode 100 of FIG. 1. FIG. 4 schematically depicts a cross-sectional view of a schottky diode according to an embodiment of the present invention. As shown in FIG. 4, the first doped regions 160 are disposed in the doped regions 140 to reduce circuit leakage of a schottky diode 200 in the wafer, wherein the first doped regions 160 has a higher doping concentration than the doping concentration of the doped regions 140. In a preferred embodiment, the first doped regions 160 and the doped regions 140 have common shapes. Preferably, the first doped regions 160 and the doped regions 140 have common top-view profiles. More precisely, the first doped regions 160 may include a plurality of first inner doped regions 162 and a first peripheral doped region surrounding 164 the first inner doped regions 162. The first inner doped regions 162 are respectively located in the corresponding inner doped regions 142, and the first peripheral doped region surrounding 164 is located in the peripheral doped region 144. Preferably, the first inner doped regions 164 have top-view profiles of circular rings, and the first peripheral doped region 164 has an inner side 164a and an outer side 164b, wherein the inner side 164a has a circular shape top-view profile while the outer side 164b has a rectangular shape top-view profile. In this embodiment, the first peripheral doped region 164 directly contacts the first isolation structures 10. In a preferred embodiment, the salicide blocks 20 only overlap a part of the first peripheral doped region 164, while the other part of the first peripheral doped region 164 protrudes from the salicide blocks 20, for reducing circuit leakage, but it is not limited thereto.

Above all, the steps of forming said doped regions or said components depend upon practical requirements, and the forming methods of these doped regions or these components are well known in the art. For instance, the embedded well 112, the first well 114, the first isolation structures 10, the doped regions 140, the doped regions 150, the junction region 130, the salicide blocks 20, the first electrode 122 and the second electrode 124 may be formed sequentially. The embedded well 112, the first well 114, the doped regions 140, the doped regions 150 and the junction region 130 may be formed by doping processes, the first isolation structures 10 may be formed by a shallow trench isolation process, the salicide blocks 20 may be formed by a deposition process, and the first electrode 122 and the second electrode 124 may be formed by salicide processes.

To summarize, the present invention provides a schottky diode, which includes a schottky junction, an ohmic junction, a first isolation structure and a plurality of doped regions. The schottky junction includes a first well in a substrate and a first electrode contacting the first well. The ohmic junction includes a junction region in the first well and a second electrode contacting the junction region. The first isolation structure is disposed in the substrate and separates the schottky junction from the ohmic junction. The doped regions are located under the schottky junction, wherein the doped regions separating from each other constitute a top-view profile of concentric circles. The doped regions have same spacings, hence the electrical performance of the schottky diode such as circuit leakage and breakdown voltage in a wafer can be uniform.

Furthermore, first doped regions may be formed in the doped regions respectively to reduce circuit leakage. Preferably, a salicide block may be formed between the first isolation structure and the first electrode, so that the first isolation structure can be separated from the first electrode. Besides, the salicide block only overlaps a part of a peripheral doped region of the doped region, while the other part of the peripheral doped region protrudes from the salicide block.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A schottky diode, comprising:
    a schottky junction comprising a first well in a substrate and a first electrode contacting the first well;
    an ohmic junction comprising a junction region in the first well and a second electrode contacting the junction region;
    a first isolation structure disposed in the substrate and separating the schottky junction and the ohmic junction; and
    a plurality of doped regions located in the first well and under the schottky junction, wherein the doped regions separating from each other constitute a top-view profile of concentric circles.

2. The schottky diode according to claim 1, wherein these doped regions comprise inner doped regions and a peripheral doped region surrounding the inner doped regions.

3. The schottky diode according to claim 2, wherein top-view profiles of the inner doped regions are circular rings.

4. The schottky diode according to claim 3, wherein the peripheral doped region has an inner side and an outer side, wherein the inner side has a circular shape top-view profile while the outer side has a rectangular shape top-view profile.

5. The schottky diode according to claim 2, wherein the spacings between the inner doped regions are the same.

6. The schottky diode according to claim 1, wherein the first well and the junction region have a first conductive type while the doped regions have a second conductive type opposite to the first conductive type.

7. The schottky diode according to claim 2, further comprising:
    a first doped region located in each of the doped regions, wherein the first doped regions have a higher doping concentration than the doped regions.

8. The schottky diode according to claim 7, wherein the first doped regions have shapes common to the corresponding doped regions.

9. The schottky diode according to claim 7, wherein the first doped regions comprise first inner doped regions and a first peripheral doped region surrounding the first inner doped regions.

10. The schottky diode according to claim 9, wherein the top-view profiles of the first inner doped regions are circular rings.

11. The schottky diode according to claim 9, wherein the first peripheral doped region has an inner side and an outer side, wherein the inner side has a circular shape top-view profile while the outer side has a rectangular shape top-view profile.

12. The schottky diode according to claim 9, wherein the first peripheral doped region directly contacts the first isolation structure.

13. The schottky diode according to claim 9, wherein the first electrode and the second electrode comprise metal silicides.

14. The schottky diode according to claim 13, wherein the first isolation structure is spaced apart from the first electrode.

15. The schottky diode according to claim 14, further comprising:
    a salicide block disposed between the first electrode and the first isolation structure.

16. The schottky diode according to claim 15, wherein the salicide block only overlaps a part of the first peripheral doped region while the other part of the first peripheral doped region protrudes from the salicide block.

17. The schottky diode according to claim 15, wherein the salicide block only overlaps a part of the peripheral doped region while the other part of the peripheral doped region protrudes from the salicide block.

18. The schottky diode according to claim 1, wherein the first well has a rectangular shape top-view profile.

19. The schottky diode according to claim 18, wherein the first well has a top-view profile of concentric rectangles.

20. The schottky diode according to claim 1, wherein an inner side of the first isolation structure has a circular top-view profile or a rectangular shape top-view profile.

* * * * *